US009496227B2

(12) United States Patent
Molin et al.

(10) Patent No.: US 9,496,227 B2
(45) Date of Patent: Nov. 15, 2016

(54) SEMICONDUCTOR-ON-INSULATOR WITH BACK SIDE SUPPORT LAYER

(71) Applicant: QUALCOMM Incorporated, San Diego, CA (US)

(72) Inventors: Stuart B. Molin, Carlsbad, CA (US); Paul A. Nygaard, Carlsbad, CA (US); Michael A. Stuber, Rancho Santa Fe, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 14/707,998

(22) Filed: May 8, 2015

(65) Prior Publication Data

US 2015/0249056 A1 Sep. 3, 2015

Related U.S. Application Data

(63) Continuation-in-part of application No. 12/836,510, filed on Jul. 14, 2010, now Pat. No. 9,034,732.

(60) Provisional application No. 61/225,914, filed on Jul. 15, 2009.

(51) Int. Cl.
*H01L 21/78* (2006.01)
*H01L 23/00* (2006.01)
(Continued)

(52) U.S. Cl.
CPC ......... *H01L 23/562* (2013.01); *H01L 21/7624* (2013.01); *H01L 21/78* (2013.01); *H01L 21/84* (2013.01); *H01L 23/36* (2013.01);
(Continued)

(58) Field of Classification Search
CPC ....... H01L 21/78; H01L 21/84; H01L 23/36; H01L 23/3677; H01L 27/1203; H01L 27/1207
See application file for complete search history.

(56) References Cited

U.S. PATENT DOCUMENTS 4,053,916 A 10/1977 Cricchi et al.
4,939,568 A 7/1990 Kato et al.
(Continued)

FOREIGN PATENT DOCUMENTS

CN 1784785 A 6/2006
CN 101140915 A 3/2008
(Continued)

OTHER PUBLICATIONS

Guarini K.W., et al., "Electrical integrity of state-of-the-art 0.13 μm SOI CMOS devices and circuits transferred for three-dimensional (3D) integrated circuit (IC) fabrication," in Electron Devices Meeting, 2002, Dec. 8-11, 2002, pp. 943-945.
(Continued)

*Primary Examiner* — Whitney T Moore
*Assistant Examiner* — Joseph Galvin, III
(74) *Attorney, Agent, or Firm* — Haynes and Boone, LLP

(57) ABSTRACT

In one embodiment, an integrated circuit with a signal-processing region is disclosed. The integrated circuit comprises a silicon-on-insulator die singulated from a silicon-on-insulator wafer. The silicon on insulator die comprises an active layer, an insulator layer, a substrate, and a strengthening layer. The substrate consists of an excavated substrate region, and a support region, the support region is in contact with the insulator layer. The excavated region covers a majority of the signal-processing region of the integrated circuit.

21 Claims, 11 Drawing Sheets

(51) Int. Cl.
  *H01L 27/12* (2006.01)
  *H01L 21/762* (2006.01)
  *H01L 21/84* (2006.01)
  *H01L 23/36* (2006.01)
  *H01L 23/367* (2006.01)
  *H01L 29/786* (2006.01)
  *H01L 23/66* (2006.01)

(52) U.S. Cl.
  CPC ........... *H01L23/3677* (2013.01); *H01L 23/66* (2013.01); *H01L 27/1203* (2013.01); *H01L 27/1207* (2013.01); *H01L 29/78603* (2013.01); *H01L 29/78606* (2013.01); *H01L 21/76256* (2013.01); *H01L 2221/6834* (2013.01); *H01L 2221/6835* (2013.01); *H01L 2221/68377* (2013.01); *H01L 2924/0002* (2013.01)

(56) References Cited

U.S. PATENT DOCUMENTS

| | | |
|---|---|---|
| 5,229,647 A | 7/1993 | Gnadinger |
| 5,376,579 A | 12/1994 | Annamalai |
| 5,434,750 A | 7/1995 | Rostoker et al. |
| 5,489,792 A | 2/1996 | Hu et al. |
| 5,580,802 A | 12/1996 | Mayer et al. |
| 5,777,365 A | 7/1998 | Yamaguchi et al. |
| 5,793,107 A | 8/1998 | Nowak |
| 5,880,010 A | 3/1999 | Davidson |
| 5,955,781 A | 9/1999 | Joshi et al. |
| 5,999,414 A | 12/1999 | Baker et al. |
| 6,027,958 A | 2/2000 | Vu et al. |
| 6,080,608 A | 6/2000 | Nowak |
| 6,110,769 A | 8/2000 | Son |
| 6,121,659 A | 9/2000 | Christensen et al. |
| 6,153,912 A | 11/2000 | Holst |
| 6,180,487 B1 | 1/2001 | Lin |
| 6,180,985 B1 | 1/2001 | Yeo |
| 6,190,985 B1 | 2/2001 | Buynoski |
| 6,191,476 B1 | 2/2001 | Takahashi et al. |
| 6,229,187 B1 | 5/2001 | Ju |
| 6,320,228 B1 | 11/2001 | Yu |
| 6,329,722 B1 | 12/2001 | Shih et al. |
| 6,352,882 B1 | 3/2002 | Assaderaghi et al. |
| 6,437,405 B2 | 8/2002 | Kim |
| 6,483,147 B1 | 11/2002 | Lin |
| 6,498,370 B1 | 12/2002 | Kim et al. |
| 6,531,753 B1 | 3/2003 | Lin |
| 6,566,240 B2 | 5/2003 | Udrea et al. |
| 6,573,565 B2 | 6/2003 | Clevenger et al. |
| 6,740,548 B2 * | 5/2004 | Darmawan ......... H01L 23/3677 257/E23.105 |
| 6,759,714 B2 | 7/2004 | Kim et al. |
| 6,833,587 B1 | 12/2004 | Lin |
| 6,847,098 B1 | 1/2005 | Tseng et al. |
| 6,889,429 B2 | 5/2005 | Celaya et al. |
| 6,900,501 B2 | 5/2005 | Darmawan |
| 7,052,937 B2 | 5/2006 | Clevenger et al. |
| 7,109,532 B1 | 9/2006 | Lee et al. |
| 7,135,766 B1 | 11/2006 | Costa et al. |
| 7,211,458 B2 | 5/2007 | Ozturk et al. |
| 7,227,205 B2 | 6/2007 | Bryant et al. |
| 7,238,591 B1 | 7/2007 | Lin |
| 7,244,663 B2 | 7/2007 | Kirby |
| 7,402,897 B2 | 7/2008 | Leedy |
| 7,485,571 B2 | 2/2009 | Leedy |
| 7,541,644 B2 | 6/2009 | Hirano et al. |
| 7,713,842 B2 | 5/2010 | Nishihata et al. |
| 7,759,220 B2 | 7/2010 | Henley |
| 7,782,629 B2 | 8/2010 | Graydon et al. |
| 7,888,606 B2 | 2/2011 | Sakamoto et al. |
| 7,906,817 B1 | 3/2011 | Wu et al. |
| 8,013,342 B2 | 9/2011 | Bernstein et al. |
| 8,232,597 B2 | 7/2012 | Stuber et al. |
| 8,357,975 B2 | 1/2013 | Stuber et al. |
| 8,859,347 B2 | 10/2014 | Stuber et al. |
| 8,912,646 B2 | 12/2014 | Stuber et al. |
| 8,921,168 B2 | 12/2014 | Stuber et al. |
| 9,029,201 B2 | 5/2015 | Nygaard et al. |
| 2002/0027271 A1 | 3/2002 | Vaiyapuri |
| 2002/0041003 A1* | 4/2002 | Udrea ................. H01L 29/7816 257/502 |
| 2002/0079507 A1 | 6/2002 | Shim et al. |
| 2002/0086465 A1 | 7/2002 | Houston |
| 2002/0089016 A1 | 7/2002 | Joly et al. |
| 2002/0163041 A1 | 11/2002 | Kim |
| 2002/0175406 A1 | 11/2002 | Callahan |
| 2003/0085425 A1 | 5/2003 | Darmawan |
| 2003/0107084 A1 | 6/2003 | Darmawan |
| 2004/0051120 A1 | 3/2004 | Kato |
| 2004/0150013 A1* | 8/2004 | Ipposhi ................ H01L 21/84 257/288 |
| 2004/0232554 A1 | 11/2004 | Hirano et al. |
| 2004/0245627 A1 | 12/2004 | Akram |
| 2004/0251557 A1 | 12/2004 | Kee |
| 2005/0124170 A1 | 6/2005 | Pelella et al. |
| 2005/0230682 A1 | 10/2005 | Hara |
| 2005/0236670 A1 | 10/2005 | Chien et al. |
| 2006/0065935 A1 | 3/2006 | Vandentop et al. |
| 2006/0183339 A1 | 8/2006 | Ravi et al. |
| 2006/0189053 A1 | 8/2006 | Wang et al. |
| 2006/0243655 A1 | 11/2006 | Striemer et al. |
| 2007/0018247 A1 | 1/2007 | Brindle et al. |
| 2007/0085131 A1 | 4/2007 | Matsuo et al. |
| 2007/0181992 A1 | 8/2007 | Lake |
| 2007/0254457 A1 | 11/2007 | Wilson et al. |
| 2007/0262428 A1* | 11/2007 | Summers ............ B81B 7/0038 257/678 |
| 2008/0013013 A1 | 1/2008 | Kim et al. |
| 2008/0050863 A1 | 2/2008 | Henson et al. |
| 2008/0081481 A1 | 4/2008 | Frohberg et al. |
| 2008/0112101 A1 | 5/2008 | McElwee et al. |
| 2008/0124889 A1 | 5/2008 | Roggenbauer et al. |
| 2008/0128900 A1 | 6/2008 | Leow et al. |
| 2008/0150100 A1 | 6/2008 | Hung et al. |
| 2008/0165521 A1 | 7/2008 | Bernstein et al. |
| 2008/0283995 A1 | 11/2008 | Bucki et al. |
| 2008/0286918 A1 | 11/2008 | Shaviv |
| 2008/0288720 A1 | 11/2008 | Atwal et al. |
| 2008/0296708 A1 | 12/2008 | Wodnicki et al. |
| 2008/0308946 A1 | 12/2008 | Pratt et al. |
| 2009/0011541 A1 | 1/2009 | Corisis et al. |
| 2009/0026454 A1 | 1/2009 | Kurokawa et al. |
| 2009/0026524 A1 | 1/2009 | Kreupl et al. |
| 2009/0073661 A1 | 3/2009 | Wolfe et al. |
| 2009/0160013 A1 | 6/2009 | Abou-Khalil et al. |
| 2010/0140782 A1 | 6/2010 | Kim et al. |
| 2010/0244934 A1* | 9/2010 | Botula ............... H01L 21/76264 327/530 |
| 2010/0314711 A1 | 12/2010 | Farooq et al. |
| 2011/0012223 A1 | 1/2011 | Molin et al. |
| 2011/0140257 A1 | 6/2011 | Sweeney et al. |
| 2011/0266659 A1 | 11/2011 | Wilson et al. |
| 2012/0161310 A1 | 6/2012 | Brindle et al. |
| 2012/0205725 A1 | 8/2012 | Nygaard et al. |
| 2013/0043595 A1 | 2/2013 | Williams |
| 2014/0175637 A1 | 6/2014 | Stuber et al. |
| 2015/0069511 A1 | 3/2015 | Nygaard et al. |
| 2015/0108640 A1 | 4/2015 | Stuber et al. |
| 2015/0140782 A1 | 5/2015 | Stuber et al. |
| 2016/0233198 A1 | 8/2016 | Stuber et al. |

FOREIGN PATENT DOCUMENTS

| | | |
|---|---|---|
| EP | 0707388 A2 | 4/1996 |
| EP | 0986104 A1 | 3/2000 |
| GB | 2309825 A | 8/1997 |
| GB | 2418063 A | 3/2006 |
| JP | 2110974 | 4/1990 |
| JP | 03011666 | 1/1991 |
| JP | 04356967 | 12/1992 |
| JP | 07098460 | 4/1995 |
| JP | 9283766 | 10/1997 |
| JP | 2001230423 A | 8/2001 |

(56) References Cited

FOREIGN PATENT DOCUMENTS

| | | |
|---|---|---|
| JP | 2004228273 A | 8/2004 |
| JP | 2005509294 A | 4/2005 |
| JP | 2005175306 A | 6/2005 |
| JP | 2006186091 | 7/2006 |
| JP | 2007329379 A | 12/2007 |
| JP | 2008004577 A | 1/2008 |
| WO | 0225700 A2 | 3/2002 |
| WO | 2008011210 A1 | 1/2008 |
| WO | 2009045859 A1 | 4/2009 |

OTHER PUBLICATIONS

Matloubian, M. "Smart Body Contact for S01 MOSFETs", SOS/SOI Technology Conference, Oct. 3-5, 1989.
Tan C.S., et al., "Wafer Level 3-D ICs Process Technology," Series on Integrated Circuits and Systems, 2008, Springer, chapters 4, 5, 6, 8, 9, 10, and 12 (entire).
Extended European Search Report dated Sep. 22, 2015 for European Patent Application No. 15171021.7.
Notice of Allowance and Fees dated Aug. 31, 2015 for U.S. Appl. No. 14/572,580.
Office Action dated Aug. 4, 2015 for U.S. Appl. No. 13/725,403.
Office Action dated Aug. 5, 2015 for Chinese Patent Application No. 201080031818.X.
Office Action dated Sep. 2, 2015 for U.S. Appl. No. 14/586,668.
Official letter and search report dated Sep. 9, 2015 for Taiwanese Patent Application No. 099123131.
European Examination Report dated Mar. 19, 2013 for European Application No. 10 734 619.9.
Examination report dated Nov. 29, 2013 for European Application No. 10734619.9.
International Search Report and Written Opinion dated Oct. 14, 2010 for PCT/US2010/042026.
International Search Report and Written Opinion dated Oct. 14, 2010 for PCT/US2010/042028.
International Search Report and Written Opinion dated Mar. 22, 2011 for International Application No. PCT/US2010/042027.
International Search Report and Written Opinion dated Mar. 31, 2014 for PCT Application No. PCT/US2013/073466.
Notice of Allowance and Fees dated Aug. 19, 2014 for U.S. Appl. No. 13/725,245.
Notice of Allowance and Fees dated Aug. 20, 2014 for U.S. Appl. No. 13/725,306.
Notice of Allowance and Fees dated Feb. 11, 2015 for U.S. Appl. No. 12/836,559.
Notice of Allowance and Fees dated Jun. 18, 2014 for U.S. Appl. No. 13/746,288.
Notice of Allowance and Fees dated Nov. 27, 2012 for U.S. Appl. No. 13/459,110.
Notice of Allowance dated Mar. 22, 2012 for U.S. Appl. No. 12/836,506.
Office Action dated Apr. 13, 2015 in U.S. Appl. No. 14/586,668.
Office Action dated Apr. 23, 2014 for Chinese Patent Application No. 201080031814.1.
Office action dated Apr. 3, 2014 for U.S. Appl. No. 13/746,288.
Office Action dated Apr. 8, 2014 for Japanese Patent Application No. 2012-520758.
Office Action dated Aug. 31, 2012 for U.S. Appl. No. 12/836,559.
Office Action Dated Dec. 12, 2012 for U.S. Appl. No. 13/452,836.
Office action dated Dec. 2, 2013 for Chinese Patent Application No. 201080031818.X.
Office Action Dated Feb. 10, 2014 for U.S. Appl. No. 13/725,403.
Office Action dated Feb. 28, 2013 for U.S. Appl. No. 12/836,559.
Office action dated Ferbuary 4, 2015 for Chinese patent application No. 201080031818.X.
Office Action dated Jan. 20, 2015 for Japanese Patent Application No. 2012-520758.
Office Action dated Jan. 27, 2012 for U.S. Appl. No. 12/836,506.
Office Action dated Jan. 6, 2015 for Chinese patent application No. 201080031811.8.
Office Action dated Jul. 10, 2014 from Chinese Patent Application No. 201080031811.8.
Office Action dated Jul. 17, 2014 for U.S. Appl. No. 13/725,403.
Office Action dated Jul. 28, 2014 for Chinese Patent Application No. 201080031818.X.
Office Action dated Mar. 20, 2014 for U.S. Appl. No. 13/725,245.
Office Action dated Mar. 27, 2015 for U.S. Appl. No. 14/572,580.
Office action dated Mar. 28, 2014 for U.S. Appl. No. 13/725,306.
Office Action dated Mar. 5, 2015 for U.S. Appl. No. 13/725,403.
Office Action dated Nov. 9, 2012 for U.S. Appl. No. 12/836,510.
Office Action dated Oct. 24, 2012 for U.S. Appl. No. 13/459,110.
Office action dated Oct. 30, 2014 for U.S. Appl. No. 13/725,403.
Office Action dated Oct. 4, 2013 for U.S. Appl. No. 13/746,288.
Office Action dated Oct. 7, 2014 for U.S. Appl. No. 12/836,559.
Official Letter and Search Report dated Feb. 13, 2015 for Taiwanese patent application No. 99123128.
Official Letter and Search Report dated Mar. 6, 2015 for Taiwanese Patent Application No. 99123144.
Sematech Manufacturing and Reliability Challenges for 3D ICs using TSVs, Sep. 25-26, 2008, San Diego, California "Thermal and Strees Analysis Modeling for 3D Memory over Processor Stacks", John McDonald, Rochester Polytechnic Institute.
Sleight, Jeffry W. et al., "Dc and Transient Characterization of a Compact Schottky Body Contact Technology for SOI Transistors", IEEE Transactions on Electronic Devices, IEEE Service Center, Pisacataway, NJ, US, vol. 46, No. 7, Jul. 1, 1999.

\* cited by examiner

SEMICONDUCTOR-ON-INSULATOR WITH BACK SIDE SUPPORT LAYER

CROSS-REFERENCE TO RELATED APPLICATIONS

The application is a continuation-in-part of application Ser. No. 12/836,510, filed Jul. 14, 2010, which claims the benefit of U.S. Provisional Application No. 61/225,914 filed Jul. 15, 2009. The contents of the aforementioned applications are incorporated herein by reference in their entirety for all purposes.

BACKGROUND OF THE INVENTION

Semiconductor-on-insulator (SOI) technology was first commercialized in the late 1990s. The defining characteristic of SOI technology is that the semiconductor region in which circuitry is formed is isolated from bulk substrate by an electrically insulating layer. This insulating layer is typically silicon-dioxide. The reason silicon-dioxide is chosen is that it can be formed on a wafer of silicon by oxidizing the wafer and is therefore amenable to efficient manufacturing. The advantageous aspects of SOI technology stem directly from the ability of the insulator layer to electronically isolate the active layer from bulk substrate. As used herein and in the appended claims, the layer in which signal-processing circuitry is formed on an SOI structure is referred to as the active layer of the SOI structure.

SOI wafer 100 is shown in FIG. 1. The wafer includes substrate layer 101, insulator layer 102, and active layer 103. The substrate is typically a semiconductor material such as silicon. Insulator layer 102 is a dielectric which is often silicon-dioxide formed through the oxidation of substrate layer 101. Active layer 103 includes a combination of dopants, dielectrics, polysilicon, metal layers, passivation, and other layers that are present after circuitry 104 has been formed therein. Circuitry 104 may include metal wiring; passive devices such as resistors, capacitors, and inductors; and active devices such as transistors. As used herein and in the appended claims, the "top" of SOI wafer 100 references top surface 105 while the "bottom" of SOI wafer 100 references bottom surface 106. This orientation scheme persists regardless of the relative orientation of SOI wafer 100 to other frames of reference, and the removal of layers from, or the addition of layers to SOI wafer 100. Therefore, active layer 103 is always "above" insulator layer 102. In addition, a vector originating in the center of active layer 103 and extending towards bottom surface 106 will always point in the direction of the "back side" of the SOI structure regardless of the relative orientation of SOI wafer 100 to other frames of references, and the removal of layers from, or the addition of layers to SOI wafer 100.

Semiconductor devices are most commonly produced in bulk on large wafers comprising many individual devices which are called die. Bulk processing is one of the reasons semiconductor manufacturing is characterized by minimal variable cost production. Dice are not processed individually until very late in the overall manufacturing process. The process by which the individual dice are taken from the wafer is called singulation. Standard singulation methods include wafer saw, scribe and break, laser cutting, and other methods. All of these singulation methods have the potential to cause stress on the individual die, and could also possibly cause defects in any resultant device. SOI devices are particularly susceptible to these types of manufacturing errors because the active layer is thin, and therefore less able to protect the contained circuitry as compared to the thicker bulk substrates used in traditional semiconductor devices. Stress induced during singulation may cause plastic deformation of the active circuitry and wafer warpage which may result in silicon crystal defects such as slip and dislocation generation. These conditions will significantly decrease the electrical performance and product yield of a resulting device.

Various methods exist to provide stability to circuitry during processing. A prominent approach involves the attachment of a support structure to the wafer before individual die on the original wafer are thinned or singulated. For example, a supporting handle wafer may be attached to the active layer to add support to the active layer during singulation or thinning. This handle wafer will usually remain on the active layer and form a part of the final device. Another approach to the problem of providing stability to traditional semiconductor devices during thinning is to selectively thin a framework of wafer material in a border around a subset of die. This approach allows the substrate of individual devices to be thinned while still being supported in groups for further processing.

SUMMARY OF INVENTION

In one embodiment, an integrated circuit is disclosed. The integrated circuit comprises a silicon-on-insulator die singulated from a silicon-on-insulator wafer. The silicon-on-insulator die has an active layer, a substrate, and an insulator layer. The active layer has a signal-processing region. The insulator layer is in contact with the substrate and the active layer. The integrated circuit also comprises an excavated substrate region formed in the substrate. The integrated circuit also comprises a support region formed in the substrate. The integrated circuit also comprises a strengthening layer at least partially located in the excavated substrate region. A total surface area of the excavated substrate region exceeds a total surface area of a majority of the signal-processing region.

In another embodiment, a method is disclosed. The method comprises providing a silicon-on-insulator wafer having a silicon-on-insulator die. The silicon-on-insulator die has an active layer, a substrate, and an insulator layer. The active layer has a signal-processing region. The insulator layer is in contact with the substrate and the active layer. The method also comprises removing a portion of the substrate from the silicon-on-insulator wafer to form an excavated substrate region in the substrate and a support region in the substrate. The method also comprises depositing a strengthening layer on the excavated substrate region. The method also comprises singulating the silicon-on-insulator die from the silicon-on-insulator wafer. The excavated substrate region covers a surface area of the signal-processing region.

In another embodiment, a method of fabricating an integrated circuit if disclosed. The method comprises providing a silicon-on-insulator wafer having a silicon-on-insulator die. The silicon-on-insulator die has an active layer, a substrate, and an insulator layer. The insulator layer is in contact with the substrate and the active layer. The method also comprises removing a portion of the substrate from the silicon-on-insulator die on the silicon-on-insulator wafer to form an excavated substrate region in the substrate and a support region in the substrate. The method also comprises singulating the silicon-on-insulator die from the silicon-oninsulator wafer. The support region and the excavated substrate region form a single frame around the silicon-on-insulator die.

DETAILED DESCRIPTION OF THE PREFERRED EMBODIMENTS

Reference now will be made in detail to embodiments of the disclosed invention, one or more examples of which are illustrated in the accompanying drawings. Each example is provided by way of explanation of the present technology, not as a limitation of the present technology. In fact, it will be apparent to those skilled in the art that modifications and variations can be made in the present technology without departing from the spirit and scope thereof. For instance, features illustrated or described as part of one embodiment may be used with another embodiment to yield a still further embodiment. Thus, it is intended that the present subject matter covers such modifications and variations as are within the scope of the appended claims and their equivalents.

Embodiments of the present invention provide for the provisioning of efficient support to SOI structures. This support may be provided to SOI structures throughout the manufacturing process and when the SOI structure is deployed as an independent device. Embodiments of the present invention may additionally provide for improved heat dissipation performance while preserving the beneficial electrical device characteristics that accompany SOI architectures. In addition, devices with the aforementioned benefits can be manufactured in accordance with the present invention with very little modification to manufacturing processes that are used most often in the semiconductor industry. This is a huge advantage given that compatibility with existing manufacturing processes avoids the need for the nearly insurmountable fixed production cost investments that can face novel semiconductor solutions. Embodiments of the invention achieve these results through the utilization of back side processing; the removal of portions of the SOI substrate layer, the optional partial or complete removal of the SOI insulator layer, and the optional partial or complete deposition of strengthening layers in variant configurations on the back side of the SOI structure.

Figure 2:
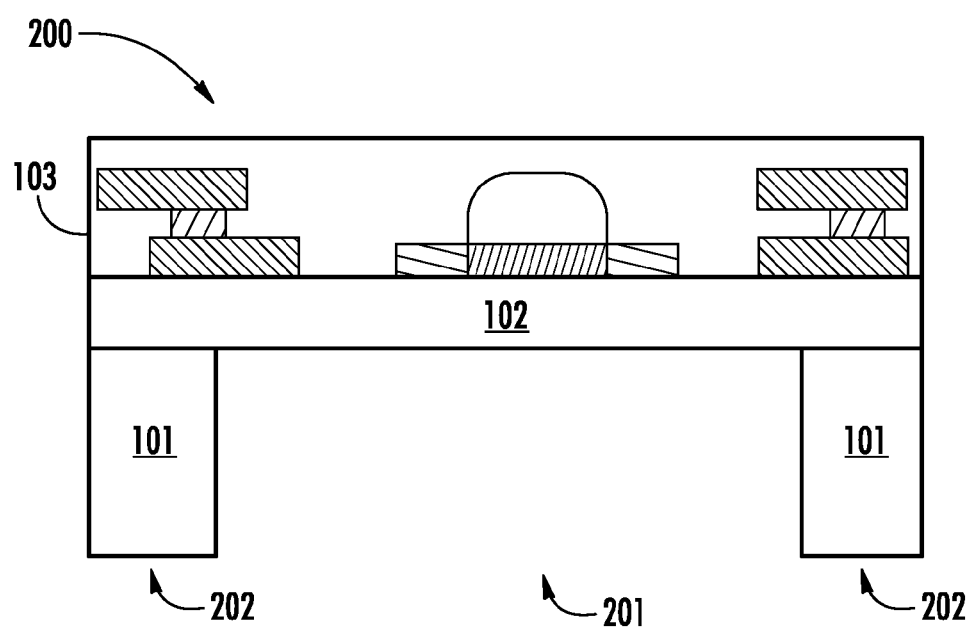
FIG. 2 illustrates a block diagram of an SOI structure with a substrate support region that is in accordance with the present invention.

An SOI structure that is in accordance with the present invention can be described with reference to FIG. 2. FIG. 2 displays a cross-sectional view of SOI die 200 which comprises active layer 103, insulator layer 102, and substrate 101. SOI die 200 has been singulated from SOI wafer 100. Substrate 101 consists of excavated substrate region 201, and support region 202. Support region 202 is in contact with insulator layer 102. Support region 202 is configured to provide a majority of a required stabilizing force to SOI die 200 when SOI die 200 is singulated from SOI wafer 100. Thereby, individual die can be reliably singulated from SOI wafer 100 in the absence of a separate support structure without suffering stress related damage.

Figure 3:
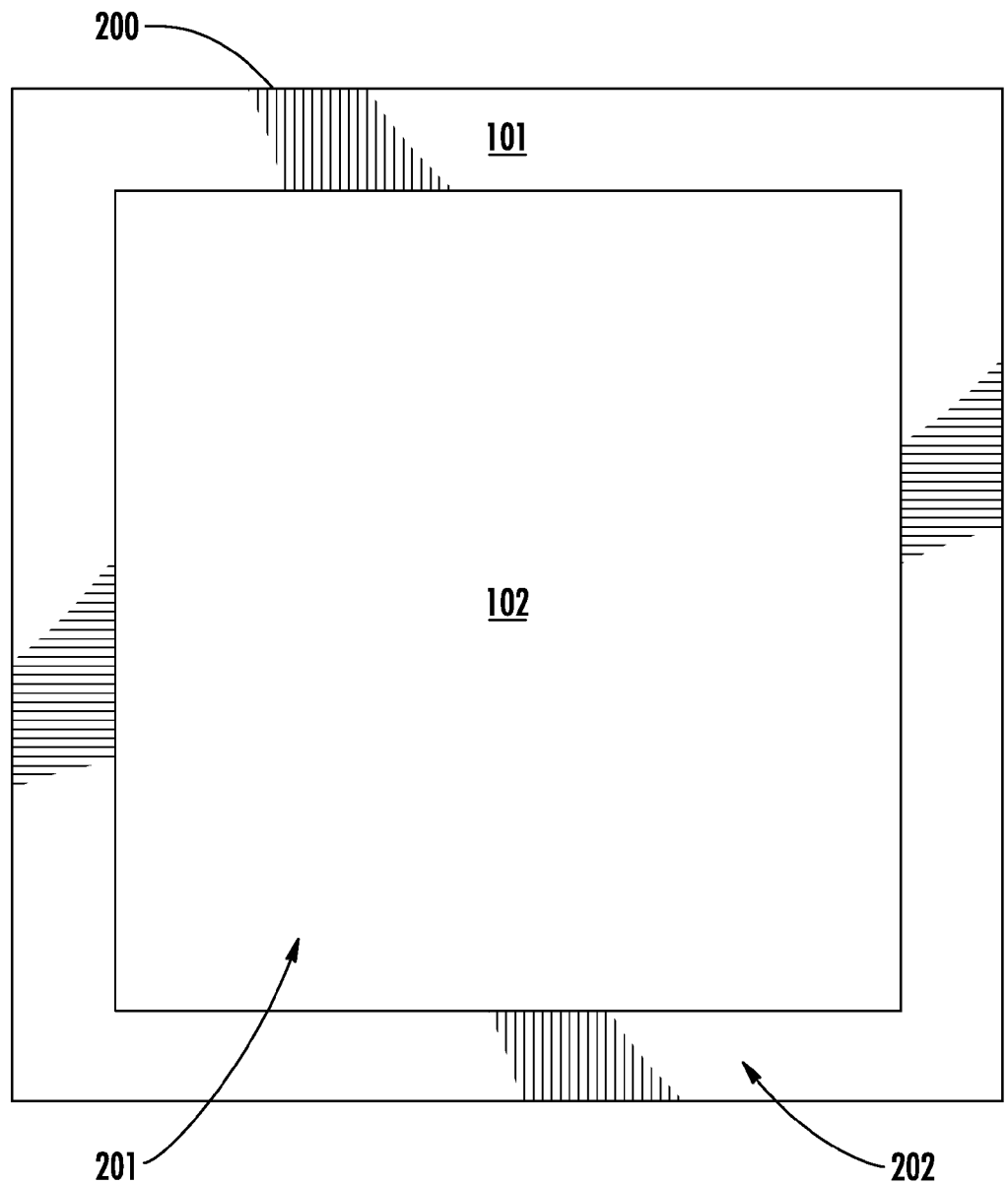
FIG. 3 illustrates a block diagram of a bottom-up view of an SOI structure with a substrate support region that is in accordance with the present invention.

A pattern for support region 202 that is in accordance with the present invention can be described with reference to FIG. 3. FIG. 3 displays a bottom-up view of SOI die 200. Substrate material has been removed from substrate 101 to form excavated substrate region 201 which exposes insulator layer 102, and is surrounded by a border of remaining substrate material that forms support region 202. In specific embodiments of the invention, substrate material in excavated substrate region 201 is not completely removed, but rather the substrate in excavated substrate region 201 is merely thinned. These embodiments enable a balance between thermal dissipation characteristics and support characteristics as desired. In specific embodiments of the invention, excavated substrate region 201 is formed into more complex patterns than a standard frame. These embodiments enable a balance between thermal dissipation characteristics, electrical characteristics, and support characteristics as described below.

The patterns formed by the excavated substrate region 201 and the support region 202 can take on various configurations. The patterns can repeat on a die-level level and can include the single frame mentioned previously or the saw-tooth, sun-bursts, or square wave channel patterns described below. However, the patterns can also be irregular patterns at the die-level. For example, as described elsewhere in this specification, the pattern could cover a majority of the signal-processing region of the active layer. In other words, the pattern could have a surface area that was larger than a surface area defined by a majority of the signal-processing region. The term "cover" being used to mean that the pattern has a greater lateral extent than a majority of the signal-processing region across a plane defined by the major surface of the wafer. In this example, the substrate material would be removed underneath the signal-processing region of the circuit while the substrate was left in place underneath the clock, control, and other support circuitry. The pattern could partition the die based on the characteristics of any sub-blocks in the active layer. For example, in a mixed signal design the pattern could remove substrate material under the analog portion of the die while leaving the substrate material in place under the digital portion of the die and vice versa. As another example, the pattern could remove substrate material under a radio frequency portion of the die while leaving the substrate material in place elsewhere on the chip. Setting the pattern with reference to the circuitry formed in the integrated circuit allows for advantageous trade-offs in that the substrate can be removed below portions of the integrated circuit which are prone towards the generation of large amounts of heat while it can remain below other portions of the integrated circuit to provide stability to the integrated circuit during singulation and deployment.

Removing substrate material to form support region 202 and excavated substrate region 201 provides advantageous characteristics to die 200. When the substrate of a wafer has been removed, the thermal dissipation capabilities of the die are significantly improved because heat does not need to diffuse through the substrate to escape the vicinity of active layer 103. However, in embodiments where the entire substrate is removed, the remaining wafer holding the active layer is very thin. In some processes, the remaining wafer will be only 10 micrometers (μm) thick. As described previously, this remaining wafer would be physically fragile and prone to breakage. However, support region 202 can provide structural strength to the die so that the wafer remains structurally sound for further processing. In addition, leaving support region 202 in specific patterns can improve the electrical performance of the circuitry formed in active layer 103. Furthermore, the support offered by support region 202 can eliminate drawbacks associated with additional support structures such as handle wafers. Since support region 202 remains part of the individual die even after singulation, an integrated circuit in accordance with specific embodiments of the invention can be processed further on either the front or back side and electrical contacts can be made to circuitry in active layer 103 from either side as well.

In specific embodiments of the invention, insulator layer 102 is also removed to form an excavated insulator region. These embodiments offer enhanced thermal dissipation characteristics as insulator layer 102 is usually much less thermally conductive than substrate 101. As mentioned previously, silicon-dioxide is the ubiquitous insulator layer in modern SOI technology. At a temperature of 300 degrees Kelvin (K), silicon-dioxide has a thermal conductivity of roughly 1.4 Watts per meter per Kelvin (W/m*K). A bulk silicon substrate at the same temperature has a thermal conductivity of roughly 130 W/m*K. Therefore, removal of the insulator region can greatly enhance the thermal dissipation capabilities of a device in accordance with these embodiments.

The excavated insulator region and excavated substrate region do not have to be contiguous, but rather insulator layer 102 and substrate 101 can be patterned in various ways to expose different portions of the layer above. In specific embodiments of the invention, substrate 101 and oxide layer 102 are removed in various patterns. In specific embodiments of the invention, these patterns are identical, while in others they are not. Removing insulator layer 102 can cause significant harm to any circuitry that lies above it. Therefore, in specific embodiments of the invention, insulator layer 102 is patterned to leave insulator material below active devices in active layer 103. These embodiments therefore enable a balance between thermal dissipation characteristics, support characteristics, and electrical performance characteristics as desired. In specific embodiments of the invention, oxide layer 102 is not totally removed but is instead thinned in the excavated insulator region.

As mentioned previously, in specific embodiments of the invention, the excavated substrate region covers a majority of a signal-processing region on the SOI die. The signal-processing region of an SOI die is generally the region of the die in which the most heat is generated. A die's thermal dissipation capabilities are therefore greatly enhanced by removing the substrate directly under the signal-processing region, and this benefit improves with the more the region is exposed. Although the strengthening characteristic of the substrate region also diminishes, a highly advantageous trade-off point is met when excavated substrate region 201 exceeds a majority of the total area covered by the signal-processing region of the SOI die.

Figure 4:
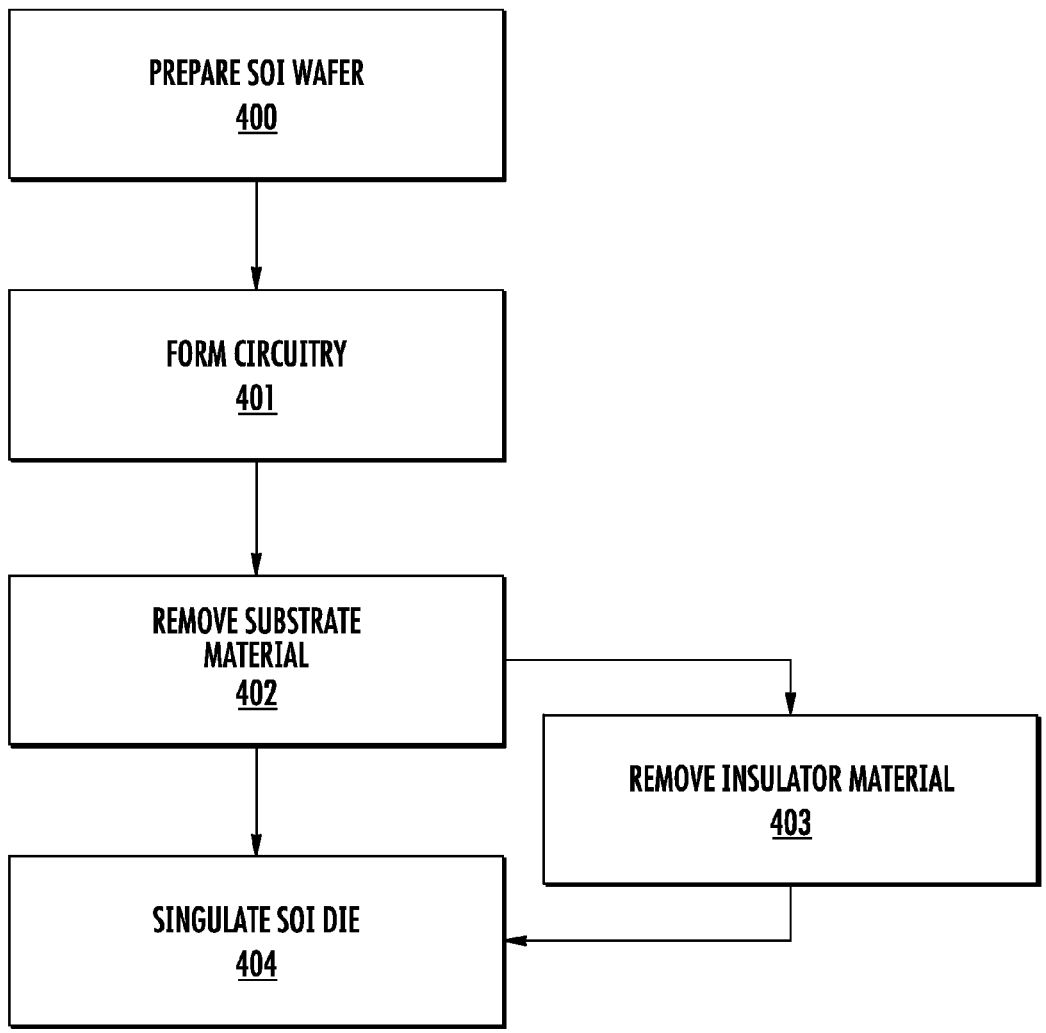
FIG. 4 illustrates a process flow chart of a method of fabricating an integrated circuit that has a substrate support region that is in accordance with the present invention.

A method of fabricating an integrated circuit that is in accordance with the present invention can be described with reference to FIG. 4. In specific embodiments of the invention, a method for producing an integrated circuit begins in step 400 with the preparation of an SOI wafer for processing. This step can comprise the actual production of an SOI wafer consisting of a layer of active silicon above a silicon-dioxide insulator as produced using SIMOX or implant and cut methods. This step could also comprise the purchase of a prefabricated SOI wafer and its preparation for further processing.

In specific embodiments of the present invention, the preparation of SOI wafer in step 400 is followed in step 401 by forming active circuitry in the active layer of the SOI wafer. The circuitry formed during this step and in this layer can include but is not limited to technologies such as CMOS, BiCMOS, SiGe, GaAs, InGaAs, and GaN. The circuitry can comprise: various active devices such as diodes and transistors; various passive devices such as resistors, capacitors, and inductors; and routing circuitry such as metal wires and vias. Various photolithographic and chemical deposition steps can be conducted to formulate this circuitry.

In specific embodiments of the invention, the formation of active circuitry in the active layer of the SOI wafer is followed in step 402 by the removal of substrate from the back side of the SOI wafer using back side processing. In specific embodiments of the invention, the substrate is removed using mechanical and chemical means independently or in combination. For example, mechanical grinding can be used to thin the substrate material from an original thickness of approximately 800 micro-meters (μm) to approximately 20 μm. In specific embodiments of the invention, step 402 is achieved by the use of mechanical grinding to remove most of the substrate material and the final 1-10 μm are removed using a plasma etch or a wet etch. If the substrate is silicon, the final thickness of substrate material may be removed with a wet etch such as KOH or TMAH. The final thickness of substrate material may also be removed using a dry plasma etch. The substrate can be removed with a high precision or etch rate ratio. The etch rate ratio refers to the ratio of the rate of desired substrate material that was removed from the back of the wafer to the rate of additional material that was removed which should not have been removed. In specific embodiments of the invention, the insulator layer is a buried-oxide that acts as an etch stop since the etch rate ratio can be extremely high for the removal of all the substrate up to the buried oxide.

In specific embodiments of the invention, the removal of substrate material in step 402 is executed so as to form any of the patterned structures described above. In specific embodiments of the invention capable of achieving this result, a masking material is left in a pattern around the perimeter of each die. This pattern is repeated on each die on the wafer. Alignment to the dice that are present on the front side of the wafer can be accomplished using infrared alignment, X-ray alignment, dual-face optical alignment, or other suitable alignment scheme. Substrate material is then preferentially etched using methods described previously while leaving the masking material substantially un-etched. In a specific embodiment of the invention, the masking material is a photoresist. In another specific embodiment, the masking material is a so-called hard mask of silicon dioxide, silicon nitride, or other suitable material.

In specific embodiments of the invention, the removal of substrate material in step 402 is followed by removal of the SOI insulator layer to form an excavated insulator region in step 403. As mentioned previously, the insulator layer may be removed altogether, merely thinned overall and left thinner than its original thickness, or may be removed in such a way that the excavated insulator layer forms any of several patterns as described above. These patterns can be formed using standard photolithographic techniques or selective chemical vapor deposition. Thinning the insulator layer must be done carefully to avoid damaging the active layer. Although only a mono-layer—on the order of 1 nm—of insulator material is needed, thinning may be limited by the uniformity of the original insulator. For example, traditional methods for insulator removal would not be able to leave a final layer of less than 5 nm if the initial layer had variations of greater than 5 nm to begin with. Additionally, these patterns can be configured to capitalize on beneficial tradeoffs in the degree to which circuitry in the active layer is shielded and the degree to which the resultant SOI structure efficiently dissipates heat.

Figure 5:
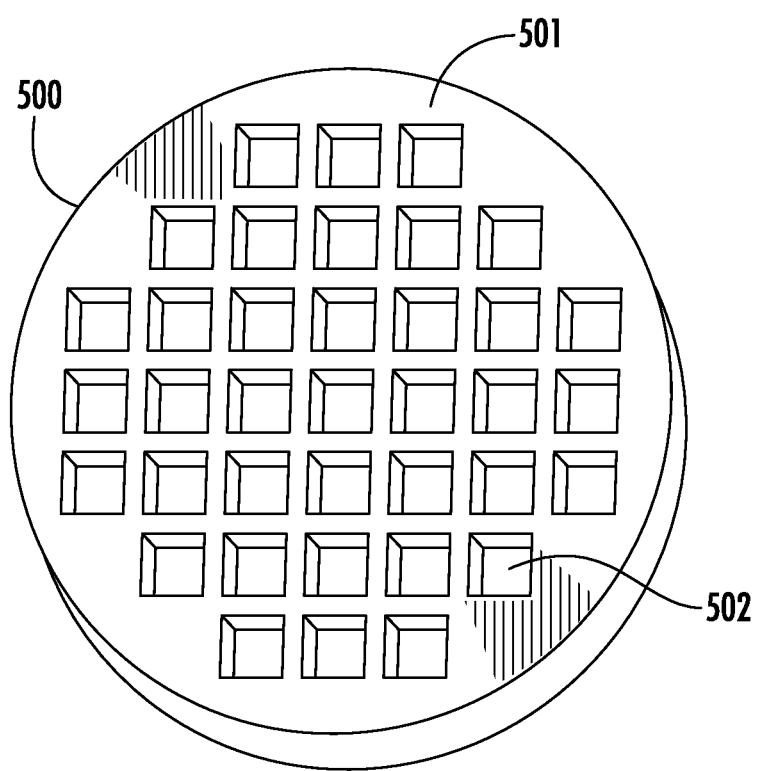
FIG. 5 illustrates a bottom-up view of an SOI wafer having individual die with substrate support regions that is in accordance with the present invention.

Following the removal of substrate material from each die in step 402 and the optional removal of insulator material in step 403, the individual die are singulated in step 404. At this point, a pattern of thick substrate is present repeating on the back of each die. In specific embodiments of the invention, this repeating pattern will be as shown in FIG. 5. In FIG. 5, SOI wafer 500 is shown from the back side having a grid-like pattern comprised of the support regions of various individual die SOI wherein each segment of the grid is occupied by an individual die such as die 502. The individual die can be singulated using standard singulation methods such as wafer saw, scribe and break, or laser cutting. In specific embodiments of the invention, the support region is configured to provide a majority of a required stabilizing force to each individual SOI die during the singulation process. The support region will therefore remain in contact with the individual die throughout the process and remain after the die has been separated from the wafer. In specific embodiments of the invention, the material forming the support region will remain with the die as it is deployed as an individual device. In specific embodiments of the invention, prior to singulation an epoxy with high thermal conductivity is applied to fill any remaining hollow die cavity that was formed during back side processing and thereby present a planar back surface to simplify later handling of the wafer and singulated die.

Figure 6:
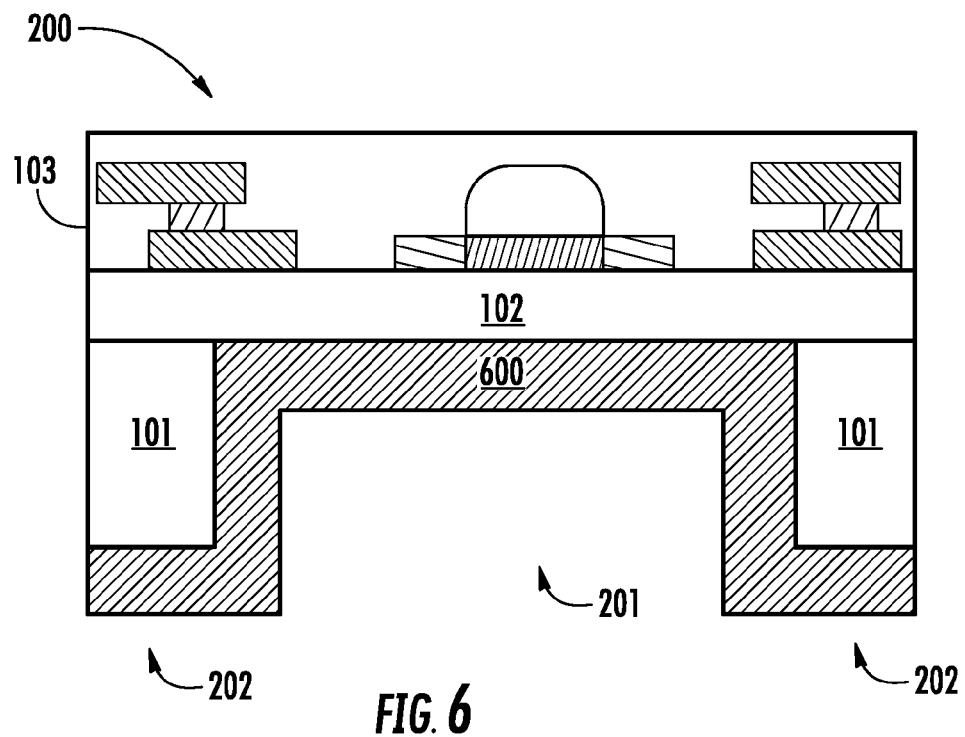
FIG. 6 illustrates a block diagram of an SOI structure having a strengthening layer that is in accordance with the present invention.

An SOI structure that is in accordance with the present invention can be described with reference to FIG. 6. FIG. 6 displays a cross-sectional view of SOI die 200 which comprises active layer 103, insulator layer 102, substrate 101, and strengthening layer 600. SOI die 200 has been singulated from SOI wafer 100. Substrate 101 consists of excavated substrate region 201, and support region 202. Support region 202 is in contact with insulator layer 102. Support region 202 and strengthening layer 600 are configured to act in combination to provide a majority of a required stabilizing force to SOI die 200 when SOI die 200 is singulated from SOI wafer 100. In accordance with these embodiments, in the absence of a separate support structure individual die can be reliably singulated from SOI wafer 100 without suffering stress related damage.

Strengthening layer 600 can be comprised of various materials and can be deposited in various configurations in accordance with the present invention. In specific embodiments of the invention, strengthening layer 600 can be deposited over the entire back surface of SOI wafer 100. In addition, strengthening layer 600 can be deposited in portions of the back surface. As described previously, substrate 101 can be removed according to certain patterns to allow for tradeoffs in terms of electrical performance characteristics, support characteristics, and thermal dissipation characteristics. In specific embodiments of the invention, the patterns in which substrate 101 is removed do not match the patterns in which strengthening layer 600 is deposited. In specific embodiments of the invention, strengthening layer 600 is congruent with excavated substrate region 201 such that the SOI die takes on the same overall shape as before substrate 101 was removed. Strengthening layer 600 can be comprised of any material with high fracture strength or high flexural strength. For example, strengthening layer 600 could be diamond, diamond-like carbon, or silicon carbide. Strengthening layer 600 can also be selected to improve the thermal dissipation performance of SOI die 200. In specific embodiments of the invention, strengthening layer 600 comprises a material having high thermal conductivity. For example, strengthening layer 600 could be diamond, diamond-like carbon, silicon carbide, aluminum oxide, aluminum nitride, beryllium oxide, beryllium nitride, or carbon nanotubes. As used herein and in the appended claims, a layer of material has high thermal conductivity if its thermal conductivity is greater than 50 W/m*K. In specific embodiments of the invention, the strengthening layer can consist of more than one layer. For example, a thin layer of very high thermal conductivity material such as diamond-like carbon or carbon nanotubes could be applied in contact with layer 102. Then, a high-thermal-conductivity material such as epoxy could be applied over the first high thermal conductivity layer, providing flexural strength and physical protection of the first layer, and possibly a planar back surface to simplify handling of the wafer and singulated die. The first, very high thermal conductivity layer, in close proximity to the heat-producing areas of the die, can act to spread heat laterally on the die, while the second, thicker, high conductivity material layer can act to further spread heat laterally and to conduct heat to the back of the die from which it can be transported away from the die.

Removing substrate material to form support region 202 and excavated substrate region 201 while at the same time depositing strengthening layer 600 provides significant advantageous characteristics to die 200. In general, the removal of substrate 101 and the deposition of a material for strengthening layer 600 with high thermal conductivity can improve the thermal dissipation performance of SOI die 200. In particular, the design constraints caused by the trade-offs associated with enhanced thermal dissipation and support are alleviated because strengthening layer 600 can offer additional support while at the same time providing a highly thermally conductive path for heat to dissipate away from active layer 103.

Figure 7:
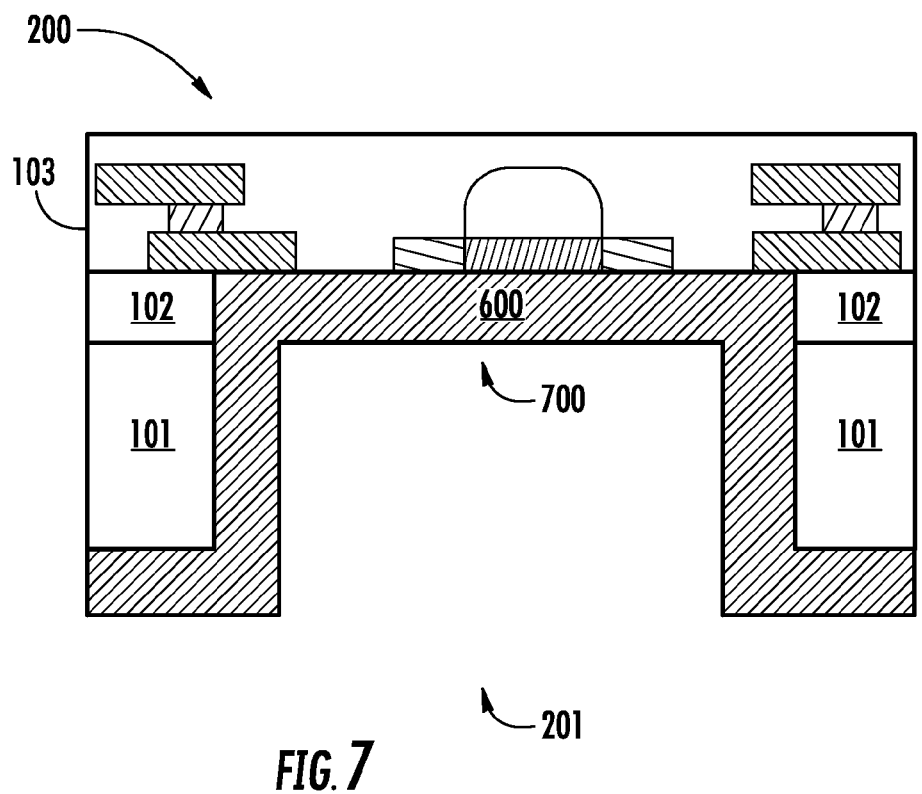
FIG. 7 illustrates a block diagram of an SOI structure having a strengthening layer in contact with the SOI active layer that is in accordance with the present invention.

An SOI structure that is in accordance with the present invention can be described with reference to FIG. 7. FIG. 7 displays a cross-sectional view of SOI die 200 which comprises substrate 101, insulator layer 102, active layer 103, and strengthening layer 600. The structure displayed in FIG. 7 is similar to that described with reference to FIG. 6 except that it additionally comprises excavated insulator region 700 in which strengthening layer 600 is disposed.

As described previously, insulator 102 can be removed according to certain patterns to allow for tradeoffs in terms of electrical performance characteristics, support characteristics, and thermal dissipation characteristics. In specific embodiments of the invention, the patterns in which insulator 102 is removed do not match the patterns in which strengthening layer 600 is deposited. In a specific embodiment, excavated insulator layer 700 spans the entire back surface of SOI die 200. In specific embodiments of the invention, strengthening layer 600 is congruent with excavated substrate region 201 in combination with excavated insulator region 700 such that the SOI die takes on the same overall shape as before substrate 101 was removed. Embodiments mentioned previously wherein strengthening layer 600 is thermally conductive are of particular utility when combined with embodiments in accordance with FIG. 7. Since insulator layer 102 is generally thermally insulating, the thermal dissipation performance of these embodiments is greatly enhanced by placing a thermally conductive material in close proximity to active layer 103. In specific embodiments of the invention, strengthening layer 600 has high thermal conductivity and is also electrically insulating. Strengthening layer 600 is advantageously electrically insulating when insulator layer 102 has been removed in such a pattern that it lies directly under active devices in active layer 103. If strengthening layer 600 is not electrically insulating, the electrical characteristics of the active devices in active layer 103 could otherwise be significantly degraded.

There are various specific patterns for excavated oxide region 700 and strengthening layer 600 in relation to active layer 103 that can provide significant benefits. In a specific embodiment of the invention, excavated insulator region 700 is at least partially laterally coextensive with a lowest layer of metal wiring in active layer 103. In specific embodiments of the present invention, this lowest metal layer is the lowest layer of wiring for the circuitry formed in active layer 103. This configuration is highly advantageous from a balancing perspective in that metal wires will not generally suffer from altered electrical characteristics if they are not placed on an insulator. In addition, metal is highly thermally conductive, and metal wiring usually links to active devices making these metal lines highly efficient channels for thermal dissipation. Although a vast majority of the heat generated in active layer 103 is generated by active devices, heat will dissipate from these active devices to the metal lines and then out through the back of the SOI structure. In another embodiment of the invention, excavated insulator layer 700 is laterally coextensive with portions of active device in active layer 103.

Figure 8:
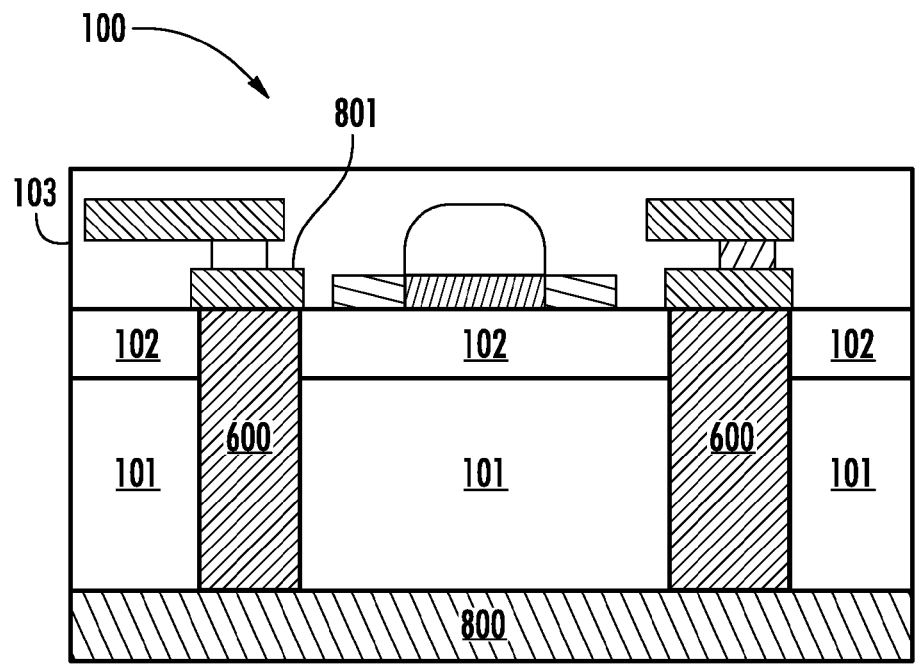
FIG. 8 illustrates a block diagram of an SOI structure having a strengthening layer on a strengthening layer substrate that is in accordance with the present invention.
Figure 8:
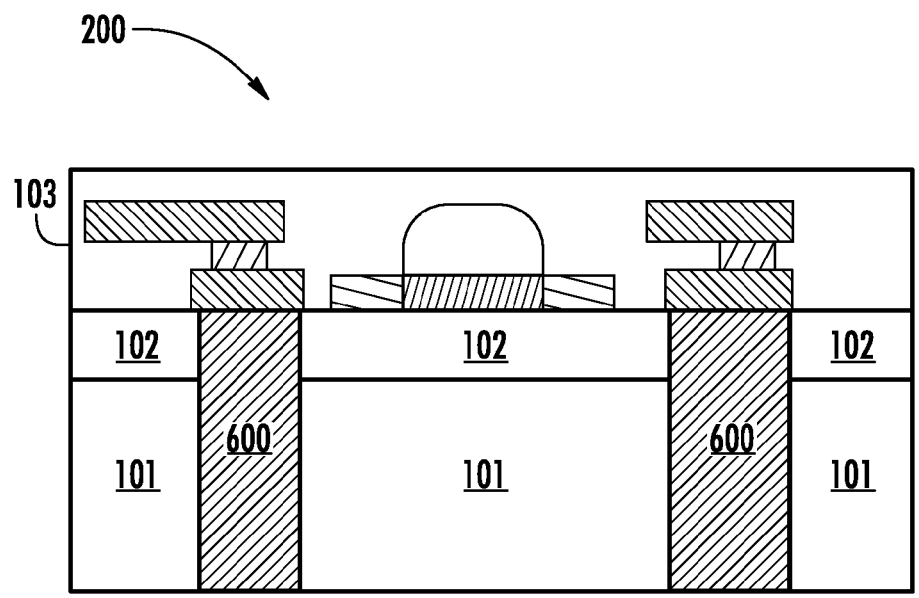

An SOI structure that is in accordance with the present invention can be described with reference to FIG. 8. FIG. 8 displays a cross-sectional view of SOI wafer 100 which comprises substrate 101, insulator layer 102, active layer 103, strengthening layer 600, and strengthening layer wafer 800. As mentioned previously, in specific embodiments of the invention, strengthening layer 600 will be congruent with the combination of excavated substrate region 201 and excavated insulator region 700. Also, as is mentioned previously, strengthening layer 600 may be thermally conductive, and excavated insulator region 700 may be laterally coextensive with lowest layer of metal 801 in active layer 103. The structure displayed in FIG. 8 exhibits these characteristics. Strengthening layer wafer 800 can be removed after or before singulation as described below. In another embodiment, strengthening layer wafer 800 can be left permanently bonded to the SOI die to provide additional physical strength and/or thermal conduction. The resultant structure is also shown in FIG. 8 as SOI die 200. In SOI die 200, each of the two pillars of strengthening layer 600 in FIG. 8 may act to both provide stability to active layer 103, and to provide an efficient channel for heat to dissipate from active layer 103. In specific embodiments of the invention, the two regions of strengthening layer 600 in FIG. 8 will be electrically isolated to allow for effective thermal dissipation without deleteriously affecting the performance of devices in active layer 103.

In specific embodiments of the invention, strengthening layer 600 takes the form of variant thermally conductive channels in contact with thermal pads on the bottom surface of active layer 103. The thermally conductive channels can spread out below active layer 103 in varying patterns including saw-tooth channels, sun-bursts, or square wave channels. These thermally conductive channels can be formed by metal pillars which could be made of copper. These metal channels could be in contact with key areas of active layer 103 such as is shown in FIG. 8. In specific embodiments of the invention, strengthening layer 600 is comprised of thermally conductive dielectric contacts directly underneath portions of active devices in active layer 103 that are connected to metal pillars that form channels to the back side of SOI wafer 100. This configuration would allow for both electrical isolation of the devices in active layer 103, greatly enhanced thermal dissipation capabilities due to close contact with active devices, and the ease of manufacturing afforded by use of strengthening layer substrate 800. In specific embodiments of the invention, the pillars of strengthening layer 600 are comprised of thermally conductive dielectric material that forms channels to the back side of SOI wafer 100. The use of thermally conductive dielectric material for the pillars would result in further improvement in electrical isolation of the devices in active layer 103.

Figure 9:
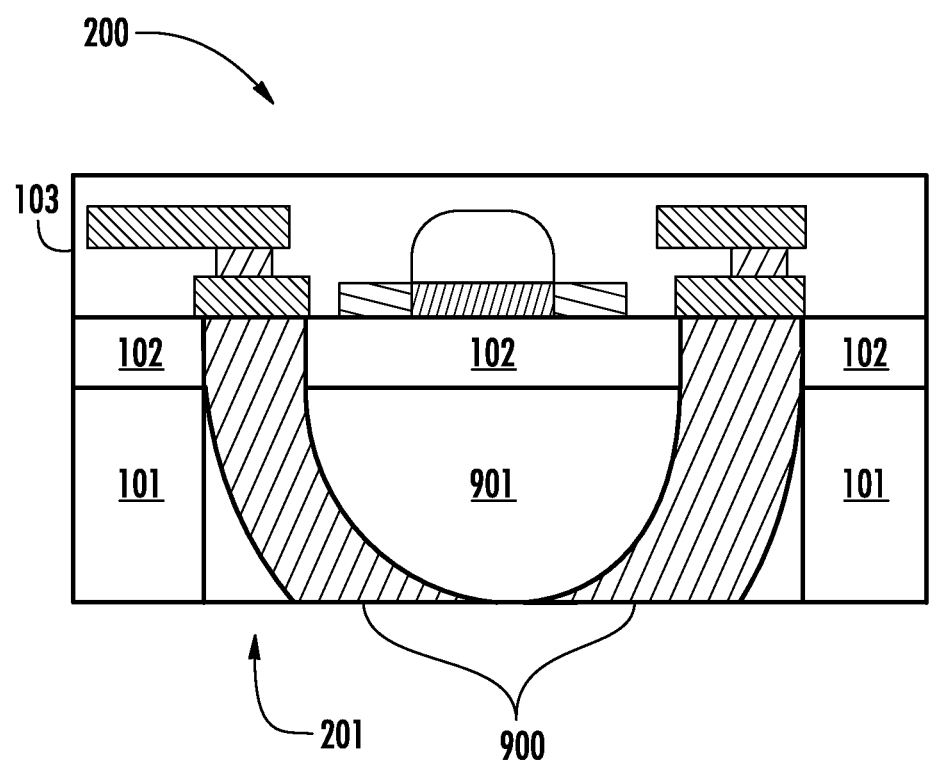
FIG. 9 illustrates a block diagram of an SOI structure having a strengthening layer comprising a bond wire that is in accordance with the present invention.

An SOI structure that is in accordance with the present invention can be described with reference to FIG. 9. FIG. 9 displays a cross-sectional view of SOI die 200 which comprises substrate 101, insulator layer 102, active layer 103, bond wire 900, and epoxy 901. As seen in FIG. 9, strengthening layer 600 can take the form of bond wires connected to thermally conductive dielectric contacts. Bond wires such as bond wire 900 contact thermal contacts on the back side of active layer 103. Epoxy 901 is disposed in the remaining cavity formed by excavated substrate region 201. Bond wire 900 would allow for the dissipation of heat from active layer 103 out the back side of SOI die 200. This structure is advantageous in that standard manufacturing processes are adept at connecting bond wires to small area contacts. In addition, a single bond wire can create two separate isolated thermal channels since epoxy 901 will hold the bond wire in place as it is severed. A process for manufacturing this structure is described below.

Figure 1:
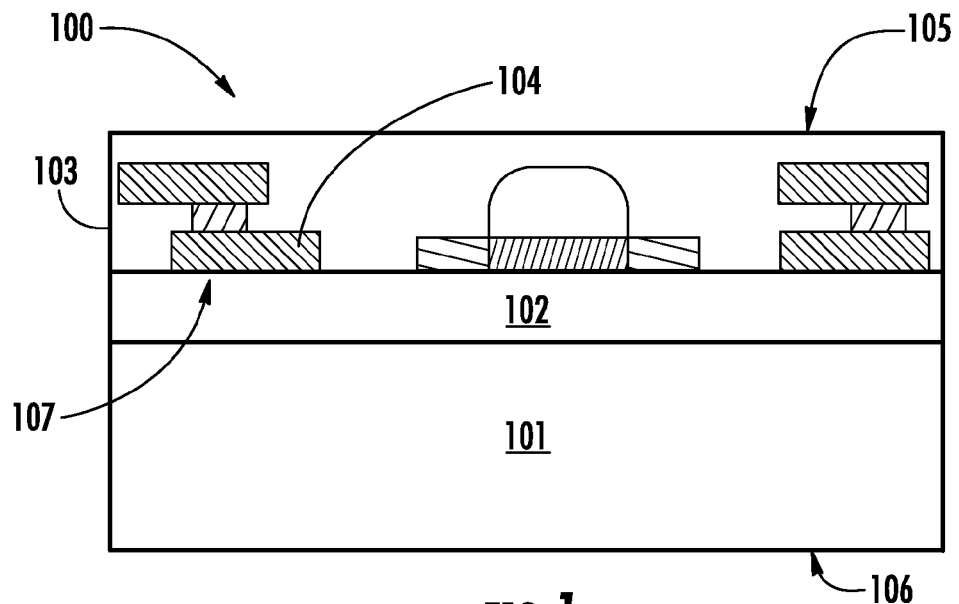
FIG. 1 illustrates a block diagram of an SOI device that is in accordance with the prior art.

Additional patterns for the excavated substrate region and support region that are in accordance with the present invention can be described with reference to FIGS. 11-13. In each figure, SOI die 1100, 1200, and 1300 can begin as an SOI wafer having a cross section similar to that shown in FIG. 1. As a result, like parts of the cross section of SOI wafer 100 will be used in reference to the SOI wafers shown in FIGS. 11-13. Variations discussed with reference to FIGS. 2-3 and 6-9, including those in which the insulator layer is removed, the substrate is thinned rather than removed, and/or those in which a strengthening layer is deposited, can all be applied to the embodiments discussed with reference to FIGS. 11-13.

Figure 11:
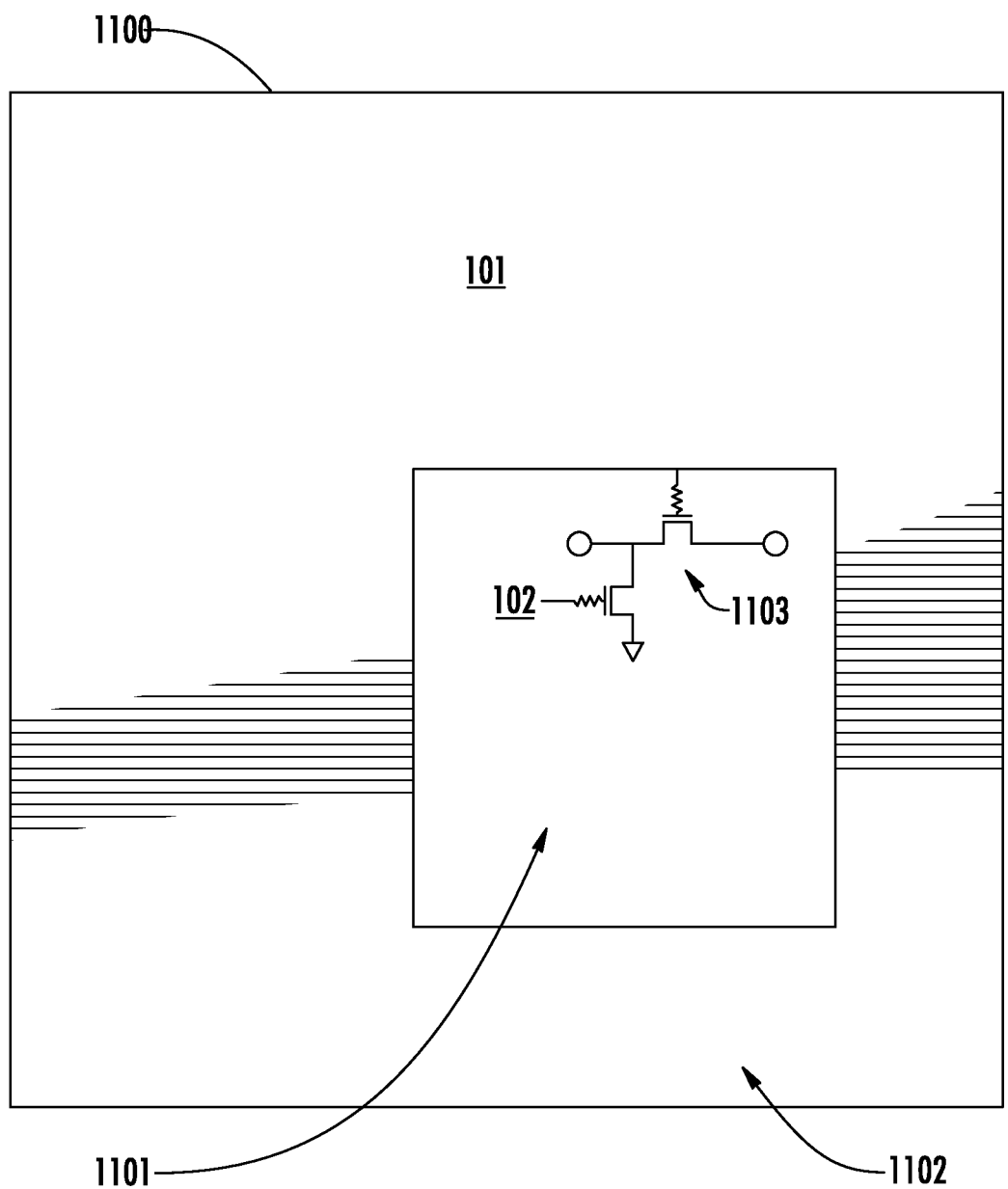
FIG. 11 illustrates a block diagram of a bottom-up view of an SOI structure with a substrate support region surrounding a radio frequency circuit block that is in accordance with the present invention.

FIG. 11 displays a bottom-up view of SOI die 1100. Substrate material has been removed from substrate 101 to form excavated substrate region 1101 which exposes insulator layer 102. The excavated substrate region 1101 is outlined by a remaining substrate material that forms support region 1102. The excavated substrate region 1101 and support region 1102 form a pattern below a signal-processing region of the integrated circuit 1103. In this illustration, the signal-processing region 1103 consists of a set of radio frequency switches or some other block of circuitry that generates a relatively large amount of heat compared to the other circuitry on the integrated circuit. For example, the integrated circuit could be a power integrated circuit in which power is the signal on which the device operates. In other words, the signal-processing region will be a portion of the circuit containing the power transistors used to regulate the power signals on which the power device is operating. In these examples, the pattern will expose the power transistors while keeping control and timing circuitry covered by support material. As mentioned above, the pattern can advantageously expose a majority of the signal-processing region of the device. As illustrated, the pattern formed by excavated substrate region 1101 and support region 1102 is a single frame around the signal-processing region.

Figure 12:
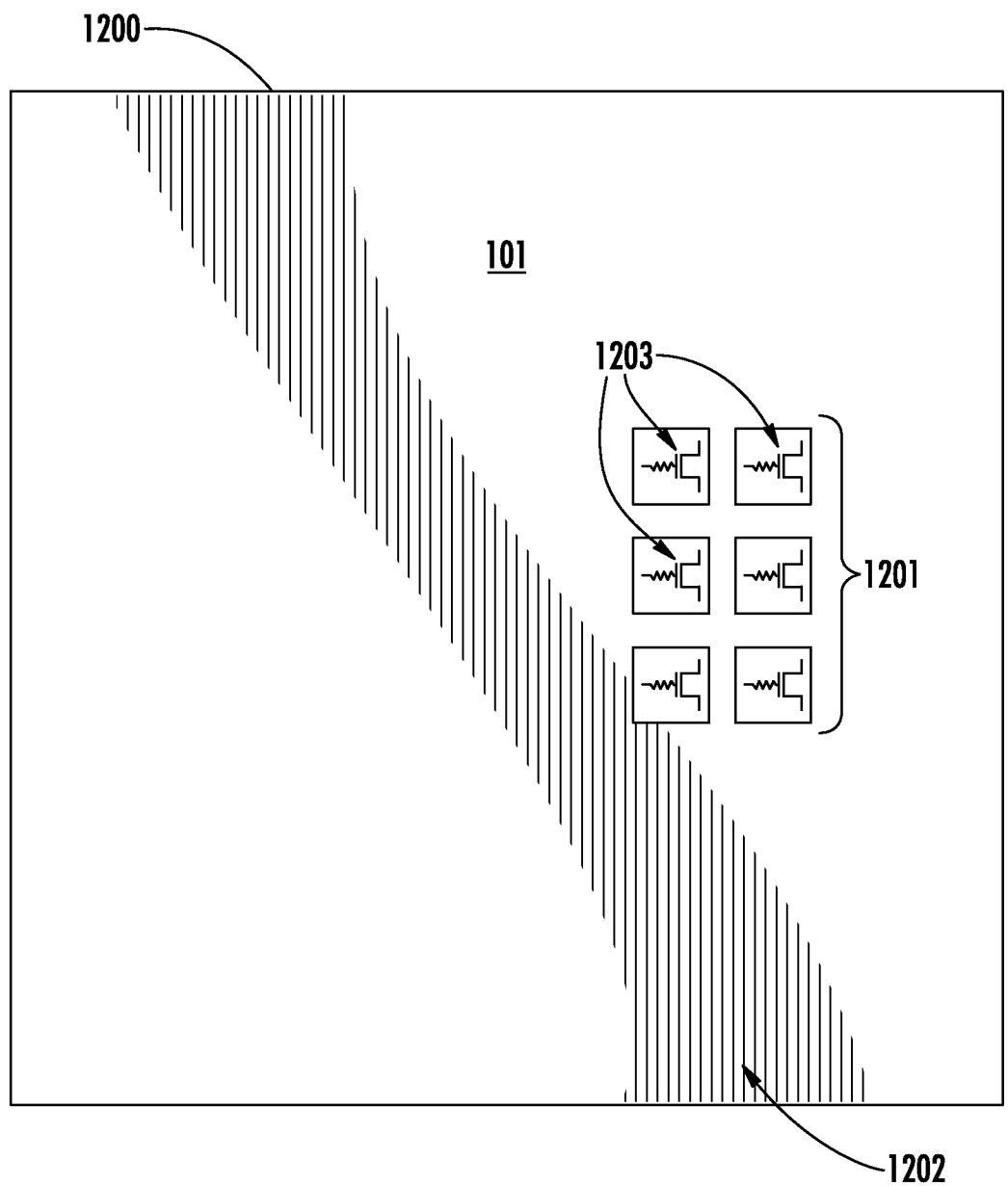
FIG. 12 illustrates a block diagram of a bottom-up view of an SOI structure with a substrate support region independently surrounding the individual radio frequency transistors of a radio frequency circuit block that is in accordance with the present invention.

FIG. 12 displays a bottom-up view of SOI die 1200. Substrate material has been removed from substrate 101 to form excavated substrate region 1201 which exposes insulator layer 102. The excavated substrate region 1201 is outlined by a remaining substrate material that forms support region 1202. As with FIG. 11, the excavated substrate region 1201 and support region 1202 form a pattern below a set of radio frequency switches or some other block of circuitry that generates a relatively large amount of heat compared to the other circuitry on the integrated circuit. The pattern illustrated in FIG. 12 is most beneficial for circuit blocks that include pockets of heat generation—such as radio frequency transistors in a radio frequency switch circuit or power transistors in a power device. In this illustration, the circuitry includes a set of radio frequency transistors 1203, and the excavated substrate region and support region form a pattern that consists of a set of frames around each transistor in the set of transistors. A similar pattern can be applied to other sub-blocks in an integrated circuit that include pockets of heat generating units in the form of resistors, transistors, or other heat generating elements.

Figure 13:
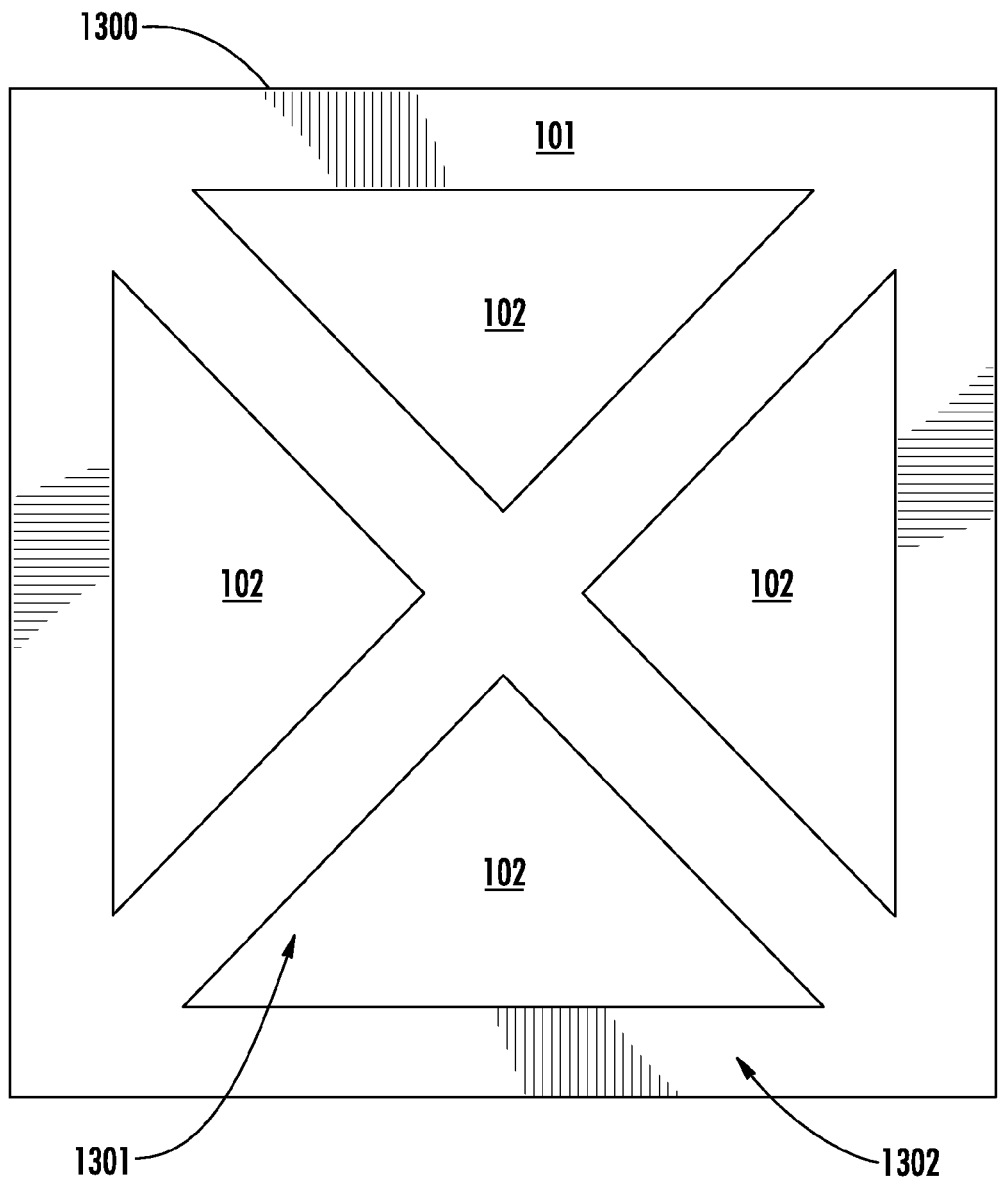
FIG. 13 illustrates a block diagram of a bottom-up view of an SOI structure with a substrate support region in a saw tooth pattern that is in accordance with the present invention.

FIG. 13 displays a bottom-up view of SOI die 1300. Substrate material has been removed from substrate 101 to form excavated substrate region 1301 which exposes insulator layer 102. The excavated substrate region 1301 forms a saw-tooth pattern with support region 1302. In this example, the saw-tooth pattern comprises a die-level pattern with two single-periods of the saw-tooth pattern stacked on top of each other. However, numerous alternatives can be applied to provide a balance between a stabilizing force and thermal dissipation performance. For example, the pattern can be applied to sub-blocks of the integrated circuit or can be applied at die level, the pattern can include numerous stacks, and each stack can include multiple periods of the pattern.

Figure 10:
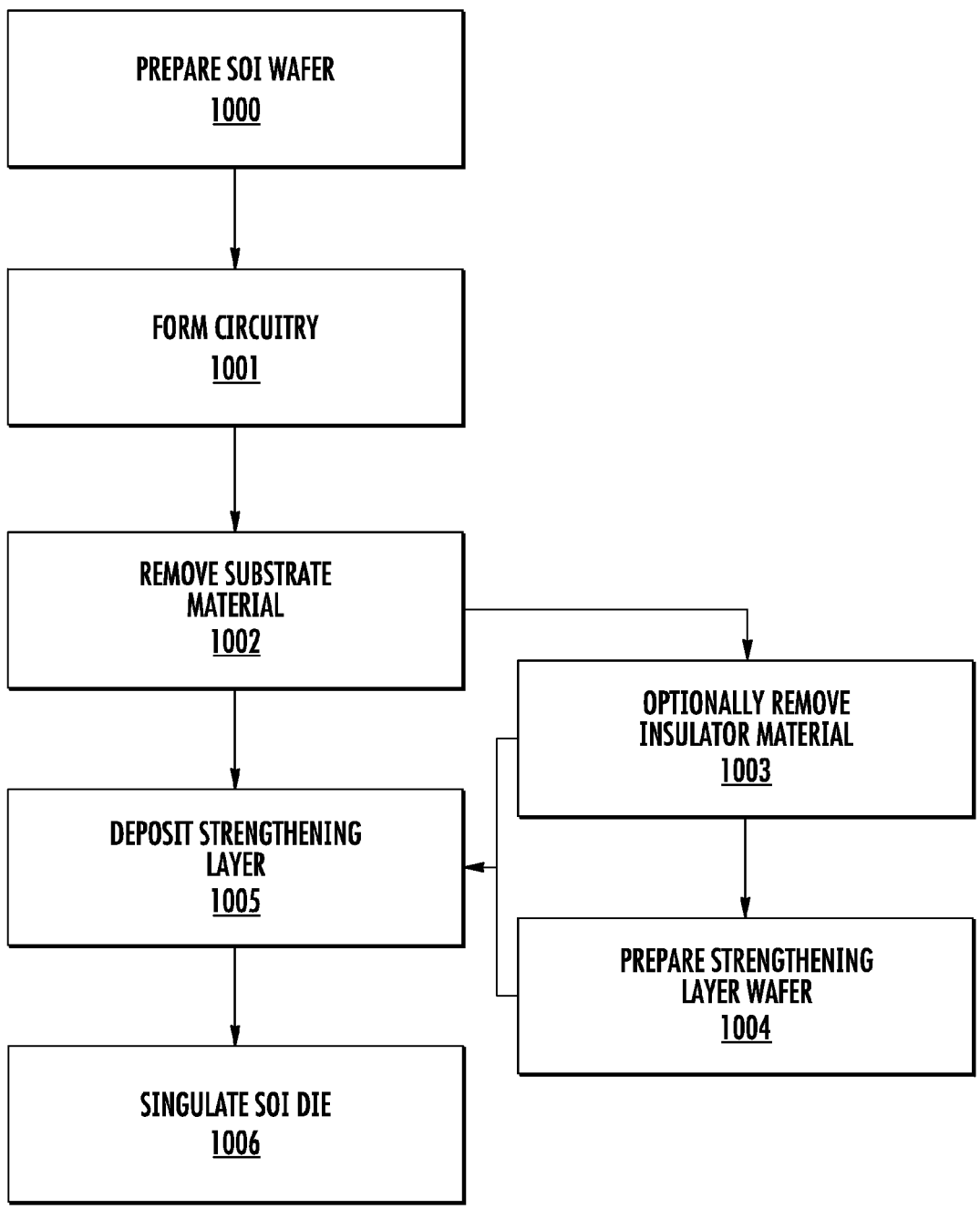
FIG. 10 illustrates a process flow chart of a method of fabricating an integrated circuit that has a strengthening layer that is in accordance with the present invention.

A method of fabricating an integrated circuit that is in accordance with the present invention can be described with reference to FIG. 10. In specific embodiments of the invention, a method for producing an integrated circuit begins in step 1000 with the preparation of an SOI wafer for processing, and continues with forming active circuitry in the active layer of the SOI wafer in step 1001. Step 1000 and step 1001 can be conducted in accordance with steps 400 and 401 respectively as described above.

In specific embodiments of the present invention, the formation of active circuitry in the active layer of the SOI wafer in step 1001 is followed in step 1002 by the removal of substrate from the back side of the SOI wafer using back side processing. Step 1002 can be conducted in accordance with step 402 as described above. In specific embodiments of the invention, step 1002 can be preceded by the temporary bonding of an SOI handle wafer to the SOI wafer being processed. Processes used to induce a temporary bond to a handle wafer include adhesives such as Brewer Science HT 10.10, 3M's WSS (Wafer Support System), HD Micro polyimide, and TMAT. In accordance with these embodiments, a much greater amount of substrate material can be removed because the substrate is not needed to support the active layer. In these embodiments, the strengthening layer that is deposited in step 1005 will ultimately provide support to the active layer.

In specific embodiments of the invention, the removal of substrate material in step 1002 is followed by removal of the SOI insulator layer to form an excavated insulator region in step 1003. Step 1003 can be conducted in accordance with step 403 as described above. In specific embodiments of the invention, this step is conducted so as to form an excavated insulator region that is in accordance with any of the relevant structures previously discussed. In specific embodiments of the invention, the insulator material is not removed at all, and the removal of substrate material 1002 is followed directly by the preparation of a strengthening layer wafer in step 1004 or the deposition of a strengthening layer to the back side of the SOI wafer in step 1005.

In specific embodiments of the invention, the removal of substrate material in step 1002, and the optional removal of insulator material in step 1004 are followed by the preparation of a strengthening layer wafer in step 1004. With reference to FIG. 8, this strengthening layer wafer comprises a strengthening layer such as strengthening layer 600 and a strengthening layer substrate such as strengthening layer substrate 800. In specific embodiments of the invention, the strengthening layer can be bonded to the strengthening layer substrate using a temporary bond such as a dissolvable solvent or an adhesive that can be removed through a heat and slide process. These embodiments allow for the later removal of strengthening layer substrate 800 after strengthening layer 600 is applied to SOI wafer 100. In other specific embodiments of the invention, strengthening layer substrate 800 may be bonded permanently to strengthening layer 600. In these embodiments, strengthening layer substrate 800 is advantageously thermally conductive as described above. In specific embodiments of the invention, the formation of strengthening layer 600 includes the deposition of metal channels on strengthening layer substrate 800. As described above, in specific embodiments of the invention these metal channels may form a strengthening layer 600 that is congruent with excavated substrate region 201 or the combination of excavated substrate region 201 with excavated insulator region 700. In specific embodiments of the invention, the formation of strengthening layer 600 would include the deposition of various materials on strengthening layer substrate 800. For example, a first layer could be metal channels to spread heat down away from active layer 103, a second layer could be a second layer of metal pillars to connect from the channels up through insulator layer 102, and a third layer could be a dielectric layer configured to be in contact with key areas of active layer 103. The dielectric layer could isolate active device in active layer 103 from the thermal channels, and could also act as a contaminant barrier so that materials such as copper used for the metal channels would not corrupt active layer 103. In this manner, any of the strengthening layer structures described above can be formed in step 1004.

In specific embodiments of the invention, the removal of substrate material in step 1002, and the optional removal of insulator material in step 1003, is followed by the deposition of a strengthening layer on the back side of the active SOI wafer in step 1005. The deposition of the strengthening layer in step 1005 is capable of forming an SOI wafer with a strengthening layer in accordance with any of the relevant structures previously discussed. In specific embodiments of the invention, this step is accompanied by the deposition of an epoxy to fill any remaining hollow die cavity that was formed during back side processing. In specific embodiments of the invention, step 1005 includes the deposition of thermal pads in the excavated substrate or insulator region. These thermal pads, as described above, may be dielectrics meant to protect key areas of active layer 103. In a specific embodiment of the invention, step 1005 includes the attachment of bond wires to these thermal pads. This can be accomplished through standard bond wire connection methods. In specific embodiments of the invention, one bond wire attaches to two thermal pads. The cavity that remains after connecting up the bond wires is filled with an epoxy which leaves the highest point of the arch formed by the bond wire exposed. A final step of processing involves cutting the bond wires at the surface of the deposited epoxy. As described above, this results in two isolated thermally conductive channels for each attached bond wire.

In specific embodiments of the invention, the preparation of a strengthening layer wafer in step 1004, is followed by the deposition of a strengthening layer on the back side of the active SOI wafer in step 1005. In specific embodiments of the invention, this step involves aligning the active wafer with the strengthening layer wafer. The bond between the wafers can be formed by permanent organic or inorganic adhesives, oxide frit bonding, galvanic bonding, molecular fusion bonding, any form of electromagnetic bonding, and other methods for producing wafer bonds. In specific embodiments of the invention where the strengthening layer wafer comprises a temporary strengthening layer substrate, the strengthening wafer substrate can be removed during this step by dissolving the adhesive that bonded the temporary wafer or through a heat and slide technique. Dissolving the temporary bonding material should be done using a solvent that does not attack the strengthening layer itself. In specific embodiments of the invention, additional heating or compression may be required during this step to ensure that a good bond was formed between the strengthening layer and the active wafer.

In specific embodiments of the invention, the deposition of a strengthening layer in step 1005, is followed by the singulation of individual die from the SOI wafer in step 1006. Step 1006 can be conducted in accordance with step 403 above. In specific embodiments of the present invention, the strengthening layer and the support region of the substrate provide a majority of a required stabilizing force to said silicon-on-insulator die during step 1006.

Although embodiments of the invention have been discussed primarily with respect to specific embodiments thereof, other variations are possible. Various configurations of the described system may be used in place of, or in addition to, the configurations presented herein. For example, although the devices were discussed often with reference to silicon substrates and oxide insulator layers the invention will function with any form of semiconductor-on-insulator wafers, structures, or devices. For example, the invention will function in combination with silicon-on-sapphire structures. In addition, the invention can function or operate upon circuitry using any form of technology such as CMOS, bipolar, BiCMOS, SiGe, Ga, As, InGaAs, GaN and any other form of semiconductor technology or compound semiconductor technology. In addition, there may be additional layers of materials disposed between those layers mentioned herein. Semiconductor processing is a highly detailed field, and layers were only mentioned herein if they were absolutely necessary to describe the invention to avoid confusion. For example, there may be layers of passivation disposed on the active layer to prevent the circuitry from reacting with its environment. In addition, the use of the word "layer" such as when describing an active layer or an insulator layer does not preclude such layers being comprised of more than one material. For example, there may be layers of glass, or some other insulator below metal lines in active circuitry in addition to a silicon-dioxide insulator beneath the entire active layer of an SOI structure. However, the term insulator layer can cover the entire structure of the glass and silicon-dioxide insulator.

Those skilled in the art will appreciate that the foregoing description is by way of example only, and is not intended to limit the invention. Nothing in the disclosure should indicate that the invention is limited to systems that require a particular form of semiconductor processing or to integrated circuits. Functions may be performed by hardware or software, as desired. In general, any diagrams presented are only intended to indicate one possible configuration, and many variations are possible. Those skilled in the art will also appreciate that methods and systems consistent with the present invention are suitable for use in a wide range of applications encompassing any related to the structural support of electronic or photonic devices.

While the specification has been described in detail with respect to specific embodiments of the invention, it will be appreciated that those skilled in the art, upon attaining an understanding of the foregoing, may readily conceive of alterations to, variations of, and equivalents to these embodiments. These and other modifications and variations to the present invention may be practiced by those skilled in the art, without departing from the spirit and scope of the present invention, which is more particularly set forth in the appended claims.

What is claimed is:

1. An integrated circuit comprising:
a silicon-on-insulator die singulated from a silicon-on-insulator wafer, the silicon-on-insulator die having an active layer, a substrate, and an insulator layer, wherein the active layer has a clock circuit region and a signal-processing region comprising a plurality of devices, and wherein the insulator layer is in contact with the substrate and the active layer;

an excavated substrate region formed in the substrate under the plurality of devices in the signal processing region;
a support region formed in the substrate outside of the excavated substrate region and under the clock circuit region; and
a strengthening layer at least partially located in the excavated substrate region;
wherein a total surface area of the excavated substrate region exceeds a total surface area of a majority of the signal-processing region, further wherein the excavated substrate region and the support region form a pattern below the active layer, and the pattern includes a single frame around the silicon-on-insulator die.

2. The integrated circuit from claim 1, wherein the total surface area of the excavated substrate region exceeds a total surface area of a majority of the active layer.

3. The integrated circuit from claim 1, wherein:
the signal-processing region includes a set of radio frequency switches; and
the excavated substrate region and the support region form a pattern below the signal-processing region.

4. The integrated circuit from claim 1, wherein:
the signal-processing region includes a set of radio frequency switches;
the set of radio frequency switches includes a set of transistors;
the excavated substrate region and the support region form a pattern below the signal-processing region; and
the pattern includes a set of frames that is aligned with the set of transistors.

5. The integrated circuit from claim 1, wherein the strengthening layer has a thermal conductivity in excess of 50 W/m*K.

6. The integrated circuit from claim 1, wherein the strengthening layer is congruent with the excavated substrate region.

7. The integrated circuit from claim 1, wherein:
the insulator layer has an excavated insulator region; and
the strengthening layer is at least partially located in the excavated insulator region.

8. The integrated circuit from claim 7, wherein the strengthening layer comprises at least one of the following materials: diamond, diamond-like carbon, silicon carbide, aluminum oxide, aluminum nitride, beryllium oxide, beryllium nitride, or carbon nanotubes.

9. The integrated circuit from claim 7, wherein the strengthening layer is in contact with a metal layer in the silicon-on-insulator die.

10. The integrated circuit from claim 9, wherein the strengthening layer has a thermal conductivity in excess of 50 W/m*K and is electrically insulating.

11. A method comprising:
providing a silicon-on-insulator wafer having a silicon-on-insulator die, wherein the silicon-on-insulator die has an active layer, a substrate, and an insulator layer, wherein the active layer has a clock circuit region and a signal-processing region comprising a plurality of devices, and wherein the insulator layer is in contact with the substrate and the active layer;
removing a portion of the substrate from the silicon-on-insulator wafer to form an excavated substrate region under the plurality of devices in the substrate and a support region outside of the excavated substrate region and under the clock circuit region in the substrate;
depositing a strengthening layer on the excavated substrate region; and
singulating the silicon-on-insulator die from the silicon-on-insulator wafer;
wherein a total surface area of the excavated substrate region covers a surface area of the signal-processing region exceeding a total area of a majority of the signal processing region, further wherein the excavated substrate region and the support region form a pattern below the active layer, and the pattern includes a single frame around the silicon-on-insulator die.

12. The method from claim 11, wherein the excavated substrate region covers a second surface area of the active layer.

13. The method from claim 11, wherein the removing of the portion of the substrate is conducted without using a handle substrate for the silicon-on-insulator wafer.

14. The method from claim 11, wherein:
the signal-processing region includes a set of radio frequency switches; and
the excavated substrate region and the support region form a pattern below the signal-processing region.

15. The method from claim 11, wherein:
the signal-processing region includes a set of radio frequency switches;
the set of radio frequency switches includes a set of transistors
the excavated substrate region and the support region form a pattern below the signal-processing region; and
the pattern includes a set of frames that is aligned with the set of transistors.

16. The method from claim 11, wherein the strengthening layer has a thermal conductivity in excess of 50 W/m*K.

17. The method from claim 11, wherein the strengthening layer is congruent with the excavated substrate region.

18. The method from claim 11, further comprising the step of:
removing a portion of the insulator layer from the silicon-on-insulator wafer to form an excavated insulator;
wherein the depositing of the strengthening layer on the excavated substrate region also deposits the strengthening layer on the excavated insulator region.

19. The method from claim 18, wherein the strengthening layer comprises at least one of the following materials: diamond, diamond-like carbon, silicon carbide, aluminum oxide, aluminum nitride, beryllium oxide, beryllium nitride, or carbon nanotubes.

20. The method from claim 18, the strengthening layer comprising:
a set of isolated thermal dissipation channels; wherein each of the isolated thermal dissipation channels contacts a layer of metal in the active layer.

21. The method from claim 20, wherein the strengthening layer has a thermal conductivity in excess of 50 W/m*K and is electrically insulating.

* * * * *